(12) United States Patent
McGraw et al.

(10) Patent No.: US 11,683,973 B2
(45) Date of Patent: Jun. 20, 2023

(54) USE OF THIN FILM METAL WITH STABLE NATIVE OXIDE FOR SOLDER WETTING CONTROL

(71) Applicant: Universal Display Corporation, Ewing, NJ (US)

(72) Inventors: Gregory McGraw, Yardley, PA (US); William E. Quinn, Whitehouse Station, NJ (US); Steven Buswell, Eindhoven (NL)

(73) Assignee: Universal Display Corporation, Ewing, NJ (US)

( * ) Notice: Subject to any disclaimer, the term of this patent is extended or adjusted under 35 U.S.C. 154(b) by 498 days.

(21) Appl. No.: 16/778,200

(22) Filed: Jan. 31, 2020

(65) Prior Publication Data
US 2020/0251655 A1  Aug. 6, 2020

Related U.S. Application Data

(60) Provisional application No. 62/799,256, filed on Jan. 31, 2019.

(51) Int. Cl.
*H10K 71/13* (2023.01)
*B05B 1/02* (2006.01)
(Continued)

(52) U.S. Cl.
CPC ............. *H10K 71/135* (2023.02); *B05B 1/02* (2013.01); *C23C 14/04* (2013.01); *C23C 14/12* (2013.01); *C23C 14/228* (2013.01); *C23C 16/4412* (2013.01); *C23C 16/45563* (2013.01); *H01L 23/3142* (2013.01); *H01L 23/49503* (2013.01); *H01L 23/49506* (2013.01);
(Continued)

(58) Field of Classification Search
CPC ... H01L 2224/14–1412; H01L 51/0005; H01L 23/49513; H01L 23/3142; H01L 24/89; H01L 24/14
See application file for complete search history.

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.
(Continued)

*Primary Examiner* — Hoa B Trinh
(74) *Attorney, Agent, or Firm* — Butzel Long

(57) ABSTRACT

Embodiments of the disclosed subject matter provide a device including a carrier plate, and a die including a mating surface with a patterned thin film of metal or metal oxide surface bonded to the carrier plate using a solder preform with voids that overlay the patterned thin film on the die, where the oxide surface is disposed opposite a moat in a mating surface of the carrier plate, and where the voided regions remain free of solder when the solder is reflowed.

18 Claims, 21 Drawing Sheets

(51) Int. Cl.

| | |
|---|---|
| *C23C 16/455* | (2006.01) |
| *C23C 14/22* | (2006.01) |
| *C23C 14/04* | (2006.01) |
| *C23C 16/44* | (2006.01) |
| *C23C 14/12* | (2006.01) |
| *H01L 23/495* | (2006.01) |
| *H01L 23/00* | (2006.01) |
| *H01L 23/31* | (2006.01) |
| *H01L 33/62* | (2010.01) |
| *H10K 71/00* | (2023.01) |
| *H10K 71/16* | (2023.01) |

(52) U.S. Cl.
CPC ........ *H01L 23/49513* (2013.01); *H01L 24/14* (2013.01); *H01L 24/89* (2013.01); *H01L 33/62* (2013.01); *H10K 71/00* (2023.02); *H10K 71/16* (2023.02)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 6,762,119 B2 | 7/2004 | Ray |
| 7,279,704 B2 | 10/2007 | Walters |
| 7,431,968 B1 | 10/2008 | Shtein |
| 7,968,146 B2 | 6/2011 | Wagner |
| 8,944,309 B2 | 2/2015 | Forrest |
| 2003/0230980 A1 | 12/2003 | Forrest |
| 2004/0174116 A1 | 9/2004 | Lu |
| 2009/0079069 A1* | 3/2009 | Jang ............... H01L 24/14 257/737 |
| 2013/0105984 A1* | 5/2013 | Rathburn ......... H01L 24/81 257/773 |
| 2014/0235012 A1* | 8/2014 | McGraw .......... C23C 14/12 239/548 |
| 2015/0376787 A1 | 12/2015 | McGraw |
| 2017/0170140 A1* | 6/2017 | Nah ............... H01L 24/14 |
| 2017/0229663 A1 | 8/2017 | Tsai |
| 2017/0294615 A1 | 10/2017 | Van Den Tillaart |
| 2018/0102470 A1* | 4/2018 | Das ............... H01L 25/50 |
| 2019/0067232 A1* | 2/2019 | Wirz ............. H01L 24/81 |
| 2019/0203370 A1* | 7/2019 | Walczyk .......... H05K 3/188 |
| 2019/0232325 A1 | 8/2019 | McGraw |
| 2019/0386216 A1* | 12/2019 | Quinn ............ B05B 12/18 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

McGraw et al., "Vapor-phase microprinting of multicolor phosphorescent organic light emitting device arrays", Adv. Mater. DOI: 10.1002/adma.201204410.

* cited by examiner

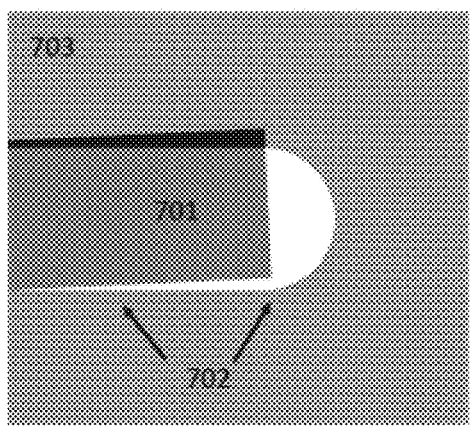 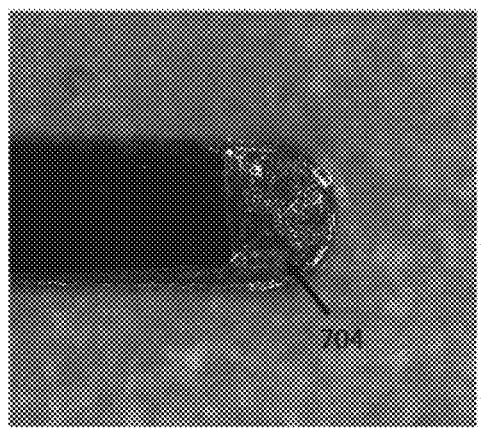
FIG. 7A                    FIG. 7B

US 11,683,973 B2

USE OF THIN FILM METAL WITH STABLE NATIVE OXIDE FOR SOLDER WETTING CONTROL

CROSS-REFERENCE TO RELATED APPLICATIONS

This application claims priority to U.S. Patent Application Ser. No. 62/799,256, filed Jan. 31, 2019, the entire contents of which are incorporated herein by reference.

FIELD

The present invention relates to a thin film of metal that may form an oxide surface over regions of a die to prevent solder from readily wetting to those regions when the die is bonded to a carrier plate.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may include a carrier plate, and a die having a mating surface with a patterned thin film of metal or metal oxide surface bonded to the carrier plate using a solder preform with voids that overlay the patterned thin film on the die. The metal oxide surface may be disposed opposite a moat in a mating surface of the carrier plate, and the voided regions may remain free of solder when the solder is reflowed.

The metal oxide surface may be disposed on one side of the device, and the moat and at least one port may be disposed on another side of the device.

The die may include a thin metal film stack disposed on the die to promote adhesion of the solder prior to the deposition of the patterned thin film. The stack may include an adhesion layer, a diffusion blocking layer, and/or a gold capping layer. The stack may be disposed on a surface of the die that includes a noble metal, which may be gold.

The patterned thin film of metal may be Al, Ti, and/or Cr. The solder free regions of the device may be discontinuous. The patterned thin film may be deposited by physical vapor deposition (PVD) through a shadow mask. The patterned thin film of the device may be a metal oxide and a semiconductor oxide.

The device may include one or more sealed fluid connections disposed between the die and the carrier plate with each fluid connection passing through a different solder free region. Perimeters of the regions covered by a patterned thin film of metal covered by the metal oxide surface may correspond to a pattern of the moat or other topographical features to contain the flow of solder formed by bonding the die face onto the carrier plate.

The die of the device may include a micronozzle array for organic vapor jet printing (OVJP). The micronozzle array may include a linear array having a plurality of depositors connected in series, where a first depositor of the plurality of depositors borders a second depositor on a least one side boundary, a delivery gas distribution channel and an exhaust distribution channel may have separate fluid communication with each of the plurality of depositors, and confinement gas distribution trenches may be disposed between at least the first depositor and the second depositor.

The die may include vias, and the solder may be excluded from the vias. The die may include silicon.

The device may include a metal with a low coefficient of thermal expansion (CTE) over the temperature range between room temperature and a reflow temperature of the solder to bond the die to the carrier plate. The metal may be molybdenum and/or controlled CTE steel.

The device may include a metal carrier plate bonded to the die with a layer of the solder. The metal carrier plate may include moats, where excess solder is captured.

According to an embodiment, a method may include depositing a film of metal over regions of a die by physical vapor deposition (PVD) using a shadow mask, where the film of metal may form an oxide surface upon exposure to air and prevent solder from readily wetting to the regions that include the film of metal, and where the oxide surface is disposed opposite a moat in a mating surface of a carrier plate. The die may be bonded to the carrier plate using solder preform with voids that overlay the film of metal on the die, where the voided regions remain free of solder when the solder is reflowed.

The metal to form the oxide surface may be deposited on one side of the die, and the moat and at least one port may be on the face of a carrier plate affixed to that side of the die (i.e., the same side of the die as the oxide surface). The metal to form the oxide surface may be titanium, tungsten, and/or gold. The metal to form the oxide surface may be titanium, tungsten, and/or gold, and an additional metal.

The method may include depositing a stack on the die before depositing the film of metal by depositing an adhesion layer to bond to the oxide surface on the die, depositing a diffusion blocking layer to prevent gold from alloying with silicon of the die, and depositing a gold cap. The stack may be deposited by at least one of electron beam evaporation and/or plasma sputtering.

The method may include bonding the die to the carrier plate a metal with a low coefficient of thermal expansion (CTE) over the temperature range between room temperature and a reflow temperature of the solder.

The method may include applying a film of patterned solder to the die as a cut metal preform. The method may include depositing a film of patterned solder on a mating surface of the carrier plate using at least one of screen printing, electroplating, and/or sputtering through a shadow mask. The film of metal may be at least one of a metal oxide and a semiconductor oxide.

BRIEF DESCRIPTION OF THE DRAWINGS

FIG. 7A shows a diagram of the orientation of a masked region of a die relative to a window in a carrier plate before a bonding experiment according to an embodiment of the disclosed subject matter.

FIG. 7B shows the masked region of a die taken through a window in the carrier plate following a bonding experiment according to an embodiment of the disclosed subject matter.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
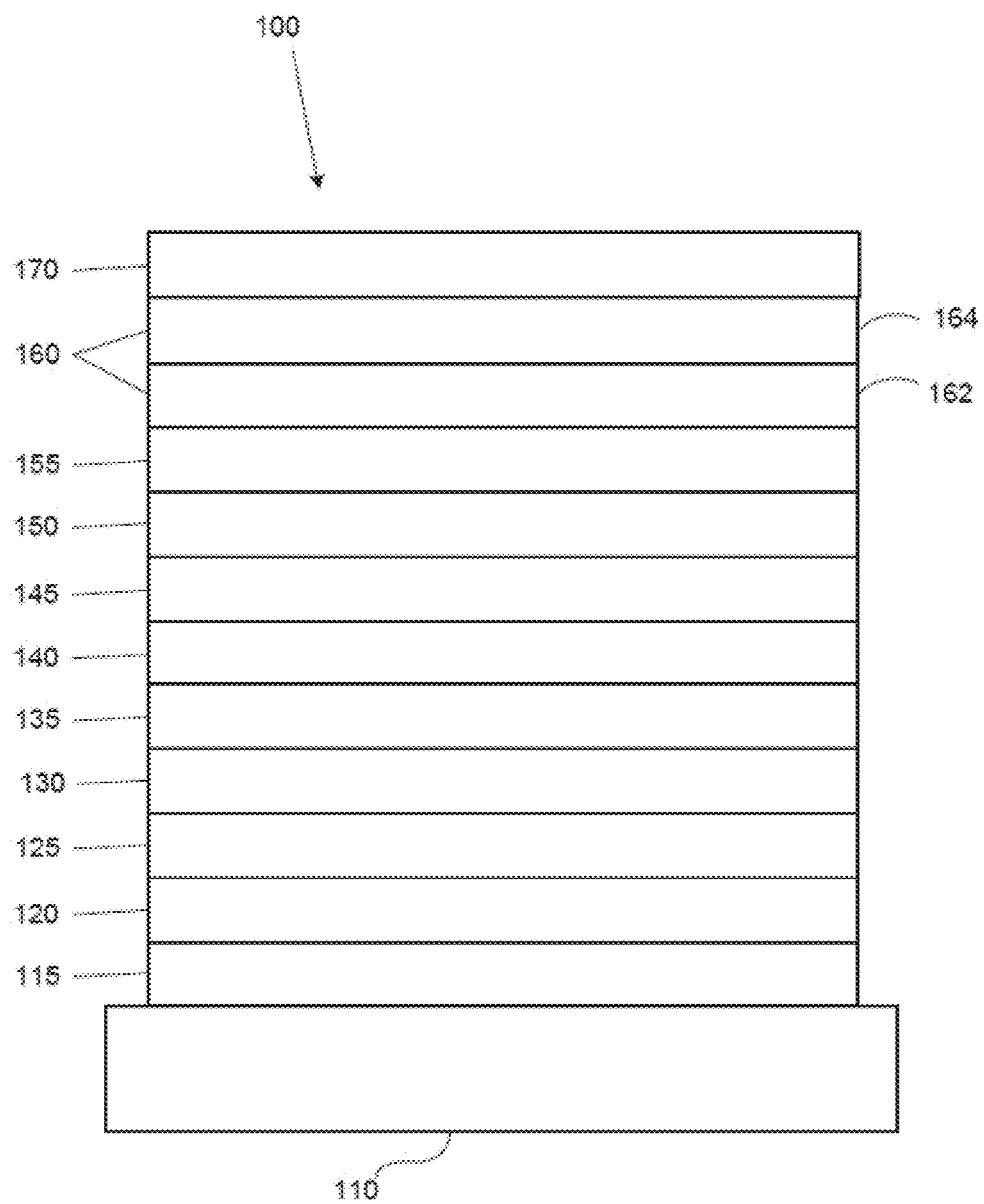
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
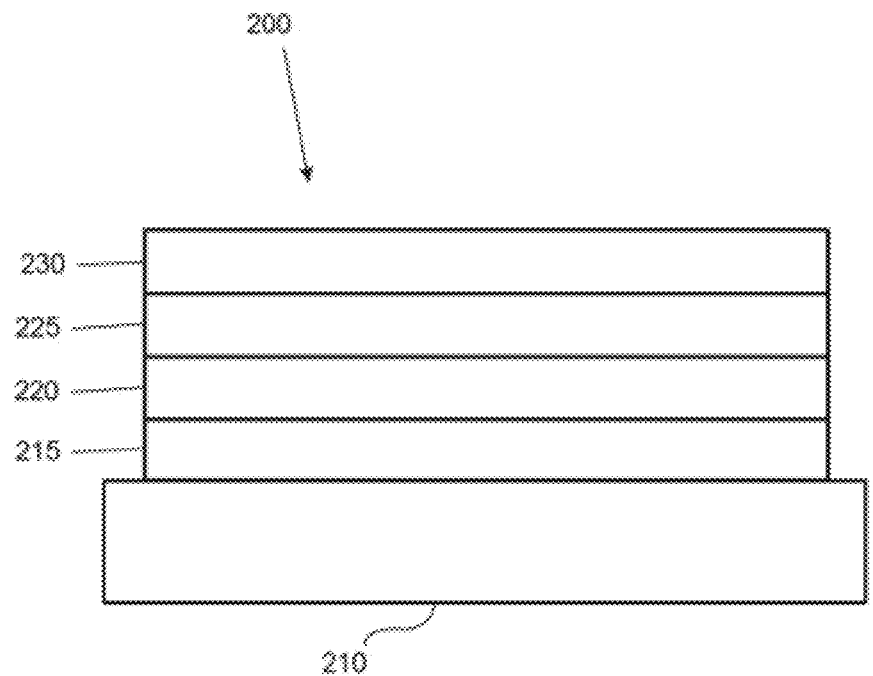
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Figure 3:
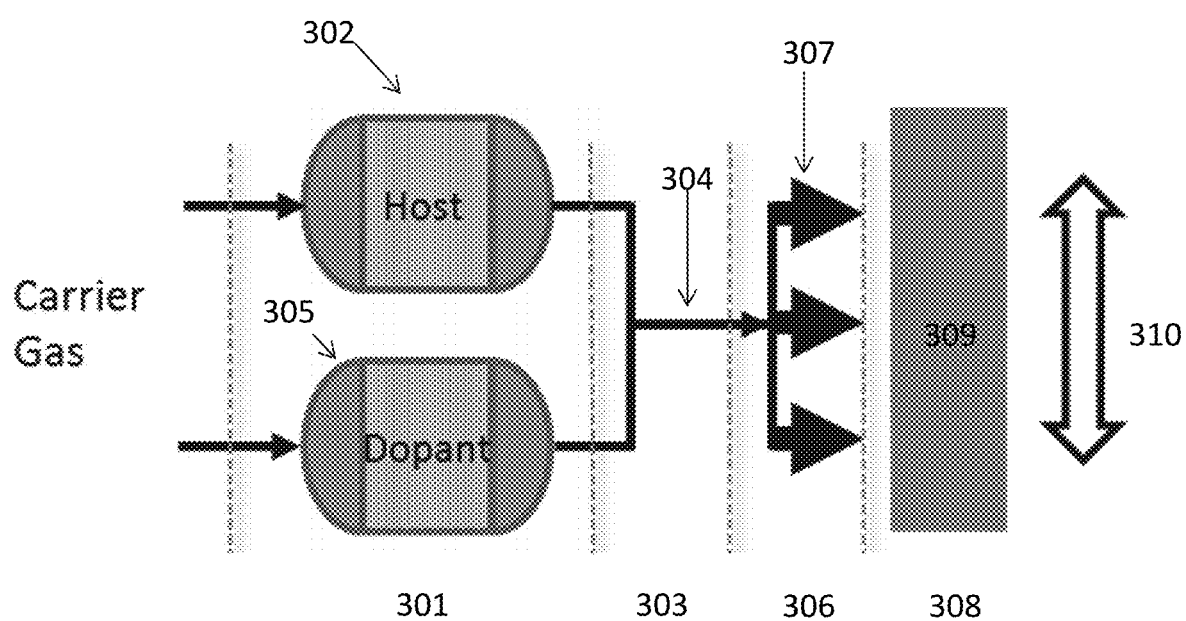
FIG. 3 shows a simplified process flow diagram of the OVJP (Organic Vapor Jet Printing) process.

Organic Vapor Jet Printing (OVJP) is a solvent-less organic thin film deposition technology that may be used to print OLED displays. OVJP may utilize a carrier gas to transport organic material from a heated source container to a print nozzle assembly which is in close proximity to a substrate. As illustrated in FIG. 3, the OVJP process may be divided into four basic operations: entrainment, mixing, jetting, and condensation. At operation 301, organic vapor generated in a source such as a sublimation oven 302 may be entrained in a stream of inert gas. At operation 303, vapors and gas streams may be mixed in a heated plenum 304 and may be optionally mixed with streams from other vapor sources 305 to make a film of the desired composition. At operation 306, a flow of mixed vapor is collimated into jets by an array of heated nozzles 307. At operation 308, organic vapor may condense on a substrate 309 where the jet impinges. The substrate may be cooler than the sublimation temperature of the organic vapor and may be actively cooled. A patterned thin film may be generated by moving 310 the substrate relative to the nozzle. In some embodiments, films may be printed as continuous lines rather than discrete pixels so that the OVJP system may operate in steady state.

The design of the print nozzle assembly and the deposition conditions may determine characteristics of the printed line. Some print heads are capable of producing printed lines with the line width (on the order of 50 μm) to deposit the emissive layers of individual subpixels in a multicolor OLED display, but the lines had overspray and printing could not be started and stopped rapidly. In embodiments of the disclosed subject matter, a micronozzle array that utilizes a combination of deposition apertures surrounded by exhaust apertures and a gas confinement flow may be used to confine the line width and overspray. This arrangement may be referred to as DEC (Deposition Exhaust Confinement).

Figure 4A:
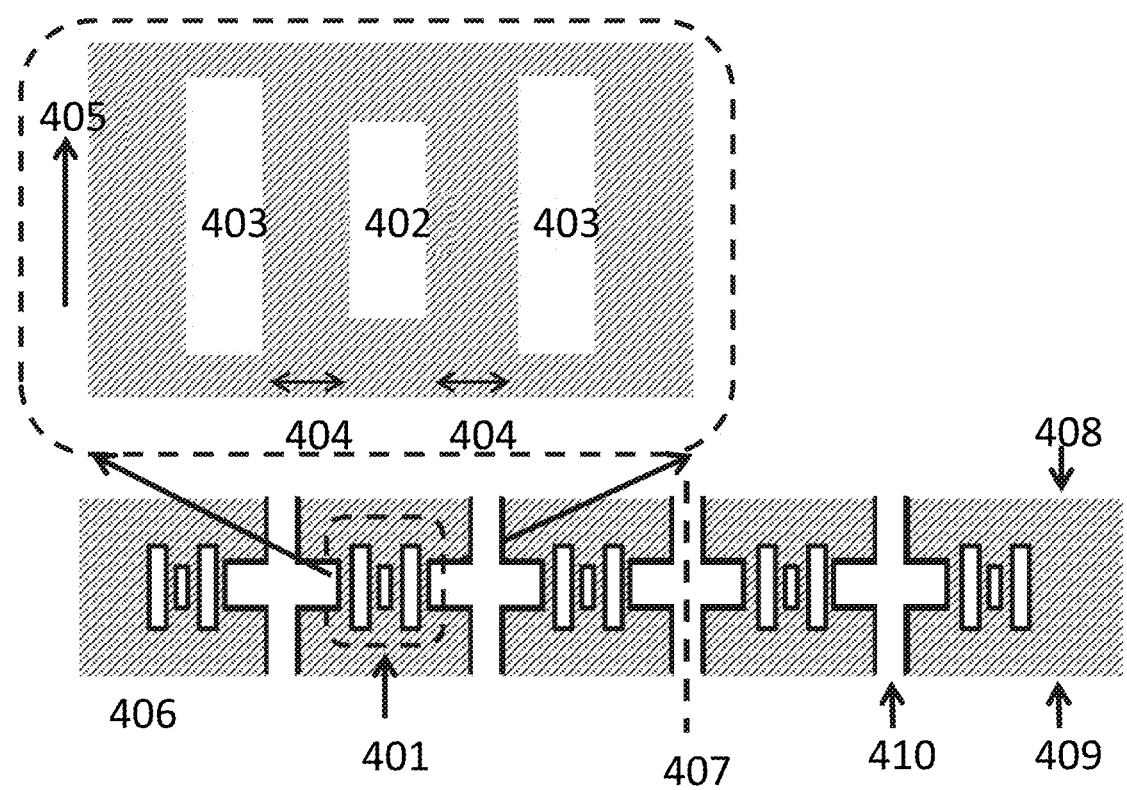
FIG. 4A shows a facial view of a DEC (Deposition Exhaust Confinement) OVJP depositor and a micronozzle array that includes a linear array of a plurality of depositors.

Gas confinement with the DEC may differ from previous OVJP arrangements, as a chamber pressure of 50 to 300 Torr is used, rather than high vacuum. Overspray may be eliminated by using a flow of confinement gas to prevent the diffusion and transport of organic material away from the desired deposition region. The DEC depositor design, shown from the perspective of the substrate in FIG. 4A, may include a planar surface 401 ported with one or more delivery apertures 402 disposed between a pair of exhaust apertures 403. The flow through the delivery apertures may include organic vapor entrained in an inert delivery gas. Exhaust apertures may withdraw gas from the region under the depositor at a mass flow rate exceeding the delivery flow. The exhausts may remove the delivery flow and any surplus organic vapor entrained within it, as well as a balance of confinement gas drawn from the ambient surrounding the depositor. Delivery and exhaust apertures may be separated by a DE spacer 404 (i.e., a depositor exhaust spacer). The apertures may be rectangular and may be arranged with the long axes of the aperture parallel to the direction of printing 405.

In some embodiments, depositors may arranged linearly on a micronozzle array 406, so that each depositor borders another on at least one side boundary 407. The top 408 and bottom 409 edges of the depositor may be defined by the edges of the micronozzle array. Confinement gas distribution trenches 410 etched into the lower face of the depositor provide a low impedance path for confinement gas so that its flow is evenly distributed across the side boundaries of each depositor. Alternately, confinement gas may flow in from the edges of the depositor, particularly if these channels are omitted. Arrays may minimize crosstalk between depositors so that multiple printed features are as close to identical as possible across the width of the depositor array. Additional exhaust apertures may be placed at the ends of the array, for example, to minimize edge effects. In some embodiments, the flow field under a micronozzle array may have periodic symmetry. Depositors may have apertures with different shapes, where the shape may produce features of specific sizes and feature profiles. If a depositor contains multiple delivery apertures, the apertures may be fed from a common delivery channel.

The average thickness t of a printed film may be given by $t=n_e j_\nu \tau/\rho$, where $j_\nu$ may be the mass flux of organic vapor onto the substrate, $\tau$ may be the period a given point on the substrate is under the aperture, and $\rho$ may be the density of the condensed organic material. The utilization efficiency, $\eta$, may be the fraction of organic vapor issuing from the depositor that condenses on the substrate. Because $\tau=l/v$, where l may be the length of the aperture and v may be the relative velocity between the print head and the substrate, a longer delivery aperture permits a given point on the substrate surface to remain under the aperture for a longer time at a given print speed. This arrangement may provide faster printing. The apertures of a DEC depositor may be generally made as long as possible.

Figure 4B:
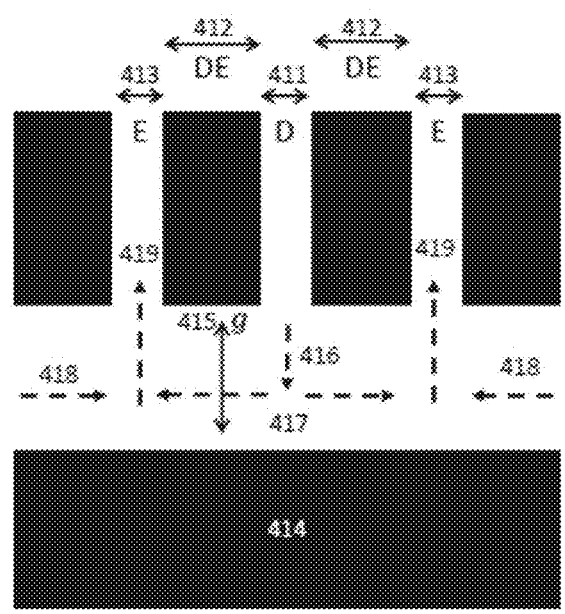
FIG. 4B shows a cross section of a DEC OVJP depositor and the gas flow through it.

A DEC depositor is shown in cross-section normal to the direction of printing in FIG. 4B. The dimensions defining the geometry of the DEC depositor are also shown in FIG. 4B. The width of the delivery aperture 411 is D. The mass flow rate of delivery gas through the delivery aperture is given by QD. The DE spacers between the delivery and exhaust have width DE 412 and the exhausts have width E 413. The mass flow rate of gas through the exhaust apertures of a depositor is QE. The depositor and substrate 414 may be separated by a fly height gap g 415. The flow patterns of process gas may be indicated by dashed arrows. A flow of delivery gas 416 laden with the organic vapor may enter through the delivery aperture at a mass flow rate of QD. This flow may deposit a thin film of organic material where it impinges on the substrate 417. The spread of undeposited organic vapor in the plane of the substrate may be resisted by a flow of confinement gas 418 that enters through the sides of the depositor at a rate of QC. Delivery and confinement flows may meet under each exhaust aperture, and may be withdrawn from the deposition zone in an exhaust flow 419 with mass flow rate QE.

Figure 5A:
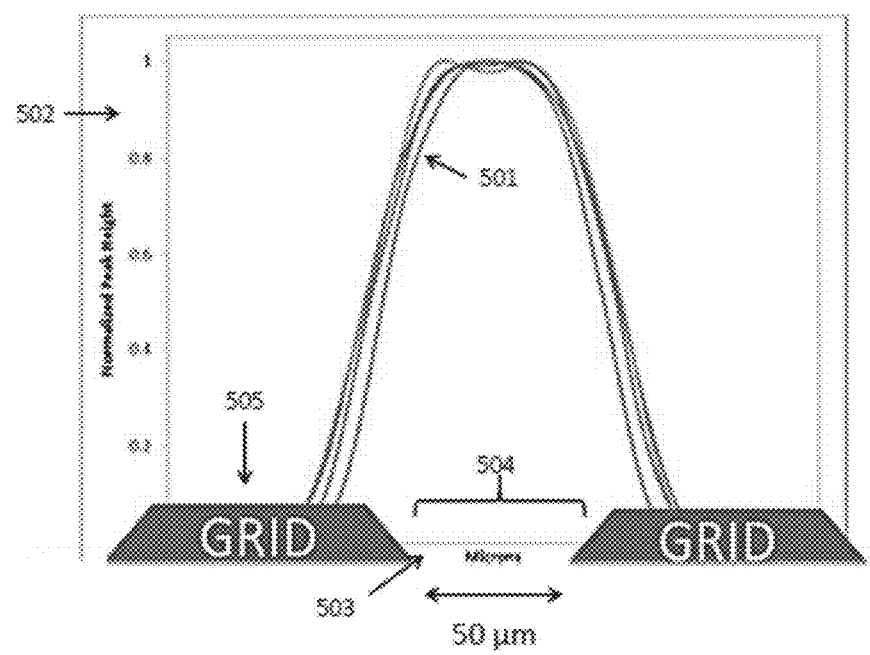
FIG. 5A shows examples of the thickness profiles of lines printed by OVJP.

Embodiments of the disclosed subject matter may provide uniform film thickness within the active area of a device, and printed features may have a mesa-like thickness profile. FIG. 5A shows mesa-like deposition profiles possible with DEC OVJP depositors and shows profilometry traces 501 for several lines printed under different process conditions. The vertical axis 502 shows normalized feature thickness, and the horizontal axis 503 indicates offset from the center of the line. The targeted printing zone may be an active area 504 between two regions of dielectric grid 505 that define the boundaries between subpixels in an OLED display. In some embodiments, the target zone may be 50 μm wide. Line profiles may range from near-Gaussian to approximately mesa-shaped, depending on process conditions. In some embodiments, the flat top of the mesa may be as wide as the active area, and the tails of the printed profile may not extend beyond the grid into the active area of a neighboring device.

Figure 5B:
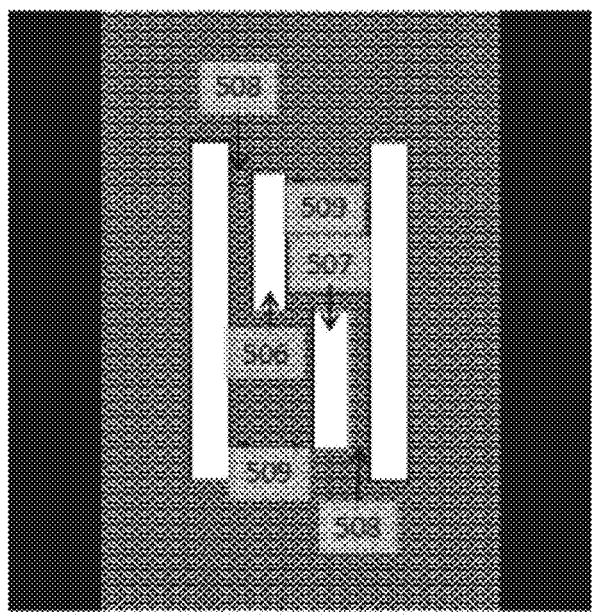
FIG. 5B shows a depositor to print subpixel sized regions of constant thickness.

A depositor, such as the one shown in FIG. 5B, may be used to print mesa-like thin film features. The delivery aperture may be split into sections 506 and 507, where the thickest portion of the of the deposition profile generated by each section may be offset from the other, and the combined printed feature created by a depositor moving with respect to a substrate may have a widened, mesa-like top. Complete features can be printed in a single pass, while depositors that produce features with a more Gaussian thickness distribution may take multiple passes. The depositor may be rotation symmetric, with each depositor being separated from one exhaust by a narrow spacer 508 on one side, and a wide spacer 509 on the other side. This structure is disclosed in U.S. patent application Ser. No. 15/475,408 filed Mar. 31, 2017 (now U.S. Patent Publn. No. 2017/0294615) and can be readily fabricated using techniques disclosed in U.S. Patent Publn. No. 2015/0376787, both of which are incorporated by reference in their entirety.

Figure 5C:
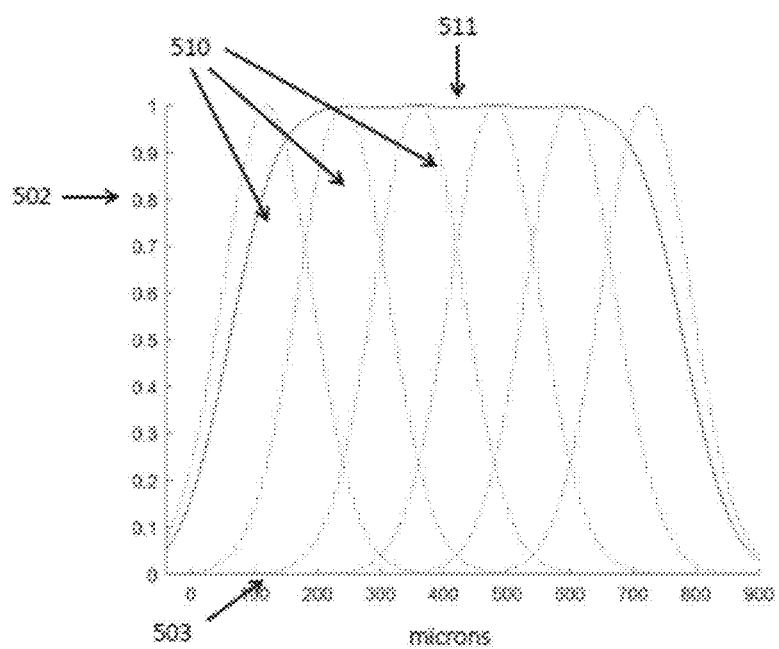
FIG. 5C show lines printed by OVJP may be superimposed to print films of constant thickness.

Blanket films of uniform thickness may be approximated by rastering the nozzles to generating overlapping lines as illustrated in FIG. 5C. Individual Gaussian deposition profiles 510 (shown as dashed lines) may be summed to form a film 511 (shown as a solid line) with a thickness variation of no more than ±0.5%. In this embodiment, individual profiles may have a standard deviation of 7.7 μm, and may be spaced 120 μm center-to-center. Areas of arbitrary shape may be filled in this fashion.

Figure 6A:
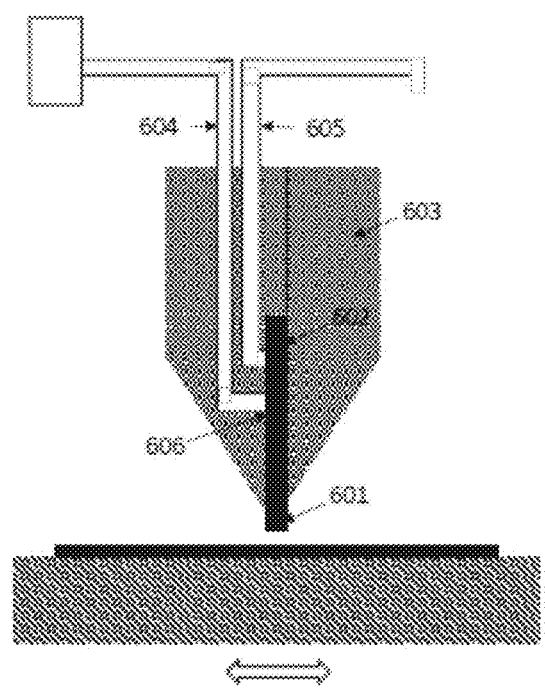
FIG. 6A shows how a die with an edge-on micronozzle array is installed in an OVJP tool.

The apertures of an OVJP micronozzle array may be located on the edge of a silicon (Si) die, as shown in FIG. 6A. The apertures may be formed when channels within the die are bisected during singulation at the lower surface 601 of the die 602. The die 602 may be held by a heated clamp 603 that is ported with a flow path for delivery gas 604 and a flow path for exhaust gas 605. The flow path for delivery gas 604 may have a 90° turn 606 upon entering the die 602. The deliver gas 604 may flow along the plane of the die 602 to the edge. Exhaust gasses follow a reverse path.

The edge-on arrangement may have a predetermined range of feature size and geometrical complexity of the depositor. Apertures may be rectangular, and they may intersect a bond line. The depositor design may be changed to use more generalized geometries. Trenches within the die may be formed by a deep reactive ion etch (DRIE) for the straightest possible sidewalls, where there may be a variation in the slope of the sidewalls. Sidewall slope variation depends on the position of a feature on the wafer, among other factors. This limits the scalability of an in-plane design since the aperture width and therefore conductance may vary significantly across a wide micronozzle array.

In some embodiments, an in-plane micronozzle array in which apertures are co-planar with the polished die face may provide advantages over an edge-on array. The shape of each aperture may be defined with sub-micron tolerances by photolithography. This may provide greater control over the conductivity of each aperture. While an in-plane design may use deep etches, such etches may be ordered so that features are relatively shallow and unaffected by sidewall slope. In-plane apertures of arbitrary shape may be defined with photolithography. The edge-on arrangement was initially preferred over an in-plane arrangement in which depositors and vias are located on opposite sides of the die to facilitate sealing. Sealing techniques developed for in-plane micronozzle arrays are described in U.S. Pat. No. 8,944,309 and U.S. Patent Publn. No. 2019/0232325, which are incorporated by reference in their entirety.

Figure 6B:
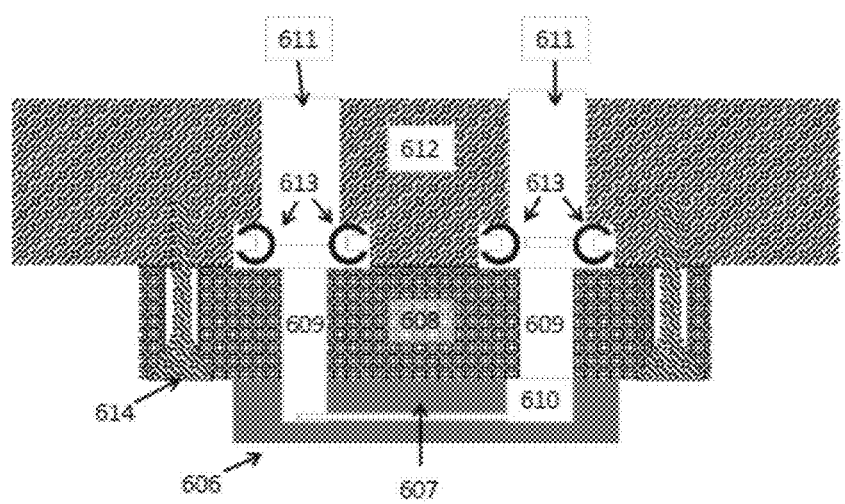
FIG. 6B shows how a die with an in-plane micronozzle array is installed in an OVJP tool.

The layout of an in-plane print head is shown in FIG. 6B. The micronozzle array may be disposed on the lower face 606 of a die 607 that is bonded by its top face to a metal carrier plate 608. A gas tight bond may be accomplished by soldering the die to the wafer using a high melting point solder such as AuGe eutectic and appropriate die bonding techniques. The metal carrier plate 608 may have ports 609 for delivery and exhaust gasses that connect to vias 610 on the die 607 through the solder seal. The ports 609 on the carrier plate 608 may connect to ports 611 on a heated manifold 612 that handles delivery and exhaust gas flow to and from the print head. The carrier plate 608 may be sealed to the manifold 612 by compression using high temperature gaskets 613, such as c-rings. The carrier plate 608 may be bolted 614 to the manifold 612. The carrier plate 608 may act as an adaptor, bridging the components of the die 607 to the larger components for high purity vapor phase printing.

Wetting control of solder may be used in die bonding. Solder may normally wet the spaces between electrodes of a die and its package in "flip chip" bonding without spreading and creating shorts. Embodiments of the disclosed subject matter may be unsuitable for traditional die bonding techniques. For example, the connection between the print head die and carrier plate may be gas-tight. Electrical or thermal conductivity may not be sufficient, since the solder may enclose a perimeter to form a seal. Solder may be excluded from vias on the die that it may enter and clog, so a film that repels solder around the vias is desirable. The seal may operate at very high temperatures, and not outgas at these temperatures. The thermal and contamination constraints may limit the choices of solders and other materials. AuGe eutectic and AuIn solder alloys may be used. Most solders melt below the operating temperature of the OVJP tool, while many braze compounds have high melting temperatures. Temperature and contamination concerns may preclude the use of flux to aid wetting.

The surfaces of both the die and the carrier plate may be prepared for the solder to wet properly. Solders may not wet to materials with oxide layers such as native oxides, so a silicon (Si) die may be coated in a thin film stack that includes a noble metal on its surface. The stack normally includes an adhesion layer that bonds to the native oxide on the die, a diffusion blocking layer to prevent gold from alloying with the Si, and a gold cap. The stack may be deposited by, for example, electron beam evaporation or plasma sputtering. In some embodiments, other noble metals may be substituted for gold.

The carrier plate may be made from a metal with a low coefficient of thermal expansion (CTE) over the temperature range between room temperature and the melting point of the solder used to bond the die to the carrier plate. Otherwise, it is likely to crack the Si die. The melting point of the solder may be above the operating temperature range of the OVJP tool, which may be up to 400° C. Elemental molybdenum and controlled CTE steels like Kovar may be used for the carrier plate. These metals have strong native oxides, and may be coated with noble metal so that the solder adheres.

A thick film of patterned solder alloy may be applied to a die as a cut metal preform. It may also be deposited on the mating surface of the carrier plate by screen printing, electroplating, sputtering through a shadow mask, or the like. As discussed throughout, such a thick film may be referred to as a preform, soldering may include soldering or brazing, and solder may refer to an alloy used for either soldering or brazing.

A solder wetting control strategy is disclosed U.S. Pat. No. 6,762,119, incorporated herein by reference in its entirety, in which a small amount of Cr is diffused through a gold film at specific positions to inhibit the wetting of solder in optical element assembled by die bonding.

In embodiments of the disclosed subject matter discussed below, a thin film of metal may form an oxide surface (e.g., from a stable native oxide upon exposure to air) over regions of a die by physical vapor deposition using a shadow mask to prevent solder from readily wetting to those regions when the die is bonded to a carrier plate. This may prevent solder from contaminating sensitive structures within the die.

Figure 6C:
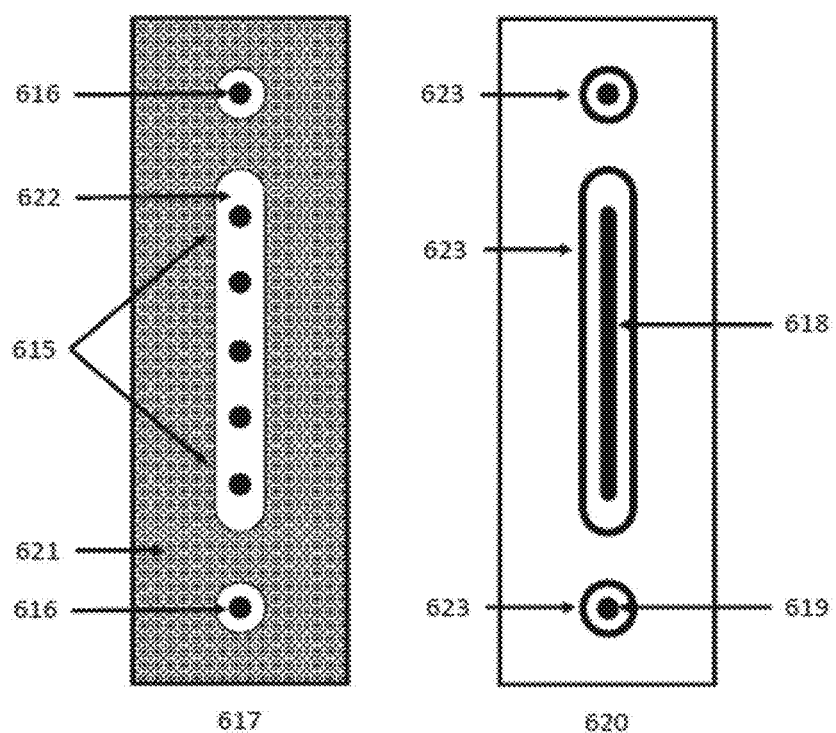
FIG. 6C shows a top view of mating surfaces of a die and its carrier plate according to an embodiment of the disclosed subject matter.

A die including a micronozzle array for OVJP deposition may be attached to a carrier plate by solder. The mating surface of the die may include one or more vias, and the mating surface of the carrier plate may include one or more ports positioned opposite to the vias. The solder may wet to both mating surfaces, and may seal the perimeters around the port to via junctions. Multiple vias may overlay a single port or vice versa, but there may be one or more sealed port to via junctions. The perimeter wetted by solder may stand off from the vias of the die by a finite distance. Otherwise, solder may wick into the vias and foul the internal structures of the die. Solder may normally spread to fill the gap between the die and carrier plate, and the methods of the disclosed subject matter may prevent it from wetting to areas near vias. An example of this arrangement is shown in FIG. 6C. A line of central vias 615 and a pair of end vias 616 on a die 617 may correspond to a slit shaped central port 618 and a pair of end ports 619 on the carrier plate 620.

The die may be processed so that solder wets well to most of its surface, but does not wet to areas adjacent to the vias. Micronozzle arrays are normally fabricated from Si, but may be made from other metal or ceramic materials. A newly fabricated die may generally present a stable oxide surface that resists wetting by solder. The oxide surface may be metallized with a thin film stack capped by gold before soldering. The non-wetting regions may be defined by either omitting the gold metallization in areas adjacent to the vias or by adding a material that forms a non-wetting oxide over those regions after gold deposition. In the example shown in FIG. 6C, the wetting area 621 on the die may be cross hatched, while the non-wetting areas 622 are solid white. Moats 623 may be milled into the carrier plate along paths corresponding to the perimeter of the non-wetting regions of the die, as discussed in detail below.

In the first embodiment, the gold metallization may be absent from areas of the die surrounding the vias. This may be achieved by masking the die with tape prior to metallization, but this may be unsuitable for mass fabrication. Alternately, the gold metallization may be deposited in two deposition cycles with a shadow mask. Masking an island around a via on a substrate may be such that the corresponding island in the mask may be connected to the rest of the mask by a sprue to cast a shadow on the substrate. Two masks may be used, or, at a minimum, a single mask may be reoriented between depositions so that points beyond the perimeter of a non-wetting region are not shadowed twice. The non-wetting region may be formed in areas that are shadowed in both steps of the deposition. Some regions may be exposed in both steps and receive a double metallization, but the subsequent process may be tolerant to that. This process may use a plurality shadow masking steps, and the full metallization stack may be deposited twice. Wet metal patterning techniques like lift-off or chemical etching may be unsuitable for this application because the die vias may trap liquid.

An embodiment of the disclosed subject matter was experimentally verified as follows. A solid Si die was masked with adhesive polyimide tape in locations corresponding to the locations of vias on an embodiment of the OVJP print die. A gold capped metallization was deposited by electron beam evaporation. The tape was removed, and the mask was aligned with a 0.76 mm thick 81 wt % Au, 19 wt % In rectangular solder preform. The preform had oval cutouts corresponding roughly to the taped regions. A molybdenum carrier plate featuring milled ports and moats, a lapped and polished mating surface, and an electroplated gold finish was disposed on top of the preform. It was aligned so that its ports matched the positions of the preform cutouts. The assembly was heated to 520° C. under an inert atmosphere in a bonding oven.

FIG. 7A shows a diagram of the orientation of a masked region of a die relative to a window in a carrier plate before a bonding experiment according to an embodiment of the disclosed subject matter. A region of the Si surface may be masked with tape 701 during metallization. This region roughly corresponded to a 2 mm wide inspection window 702 in the carrier plate 703. FIG. 7B shows the masked region. Solder wetting appears on the region 704 of the die that was not masked during metallization, and there may be an abrupt transition to the masked region 705 where no solder is present. The die may cover the ports in the carrier plate, so it may be possible to verify the quality of the seal with a helium leak checker. Leak rates of $10^{-5}$ sccm were observed, indicating a medium to high vacuum seal. This demonstrates that a die may be sealed to a carrier plate with solder in a manner that does not foul its vias.

In another embodiment of the disclosed subject matter, an additional coating of non-wetting material may be added to regions of a die surface surrounding the vias using a shadow mask, following a blanket metallization of the die with gold. This may provide a simpler masking strategy, since the islands of non-wetting area on the die may correspond to holes in a mostly solid mask. The pattern may be applied in a single step. As discussed below, a thin film that resists solder wetting may be referred to as an oxide, and may include other passivating thin film coatings, such as nitrides.

While it is possible to deposit some oxides directly using PVD, it may be easier to deposit thin films of metals that form a stable native oxide under standard conditions. The surfaces of these films may oxidize almost instantly when removed from a PVD chamber and exposed to air. Solder may not wet to these surfaces and may adhere to portions of the substrate with an exposed gold. This embodiment may be easier to implement, since there is one masking step and the gold metallization is deposited once.

Figure 8A:
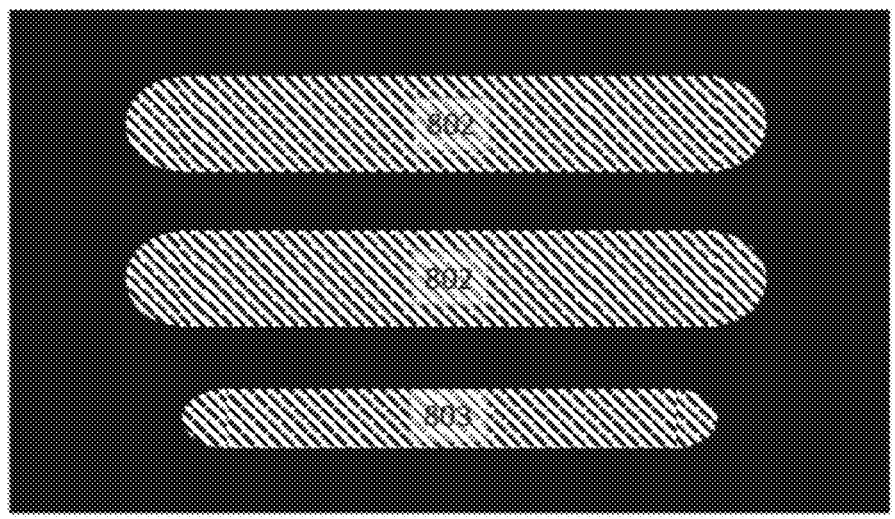
FIG. 8A shows a die with a pattern of thin film metal with an oxide surface deposited on its surface according to an embodiment of the disclosed subject matter.
Figure 8B:
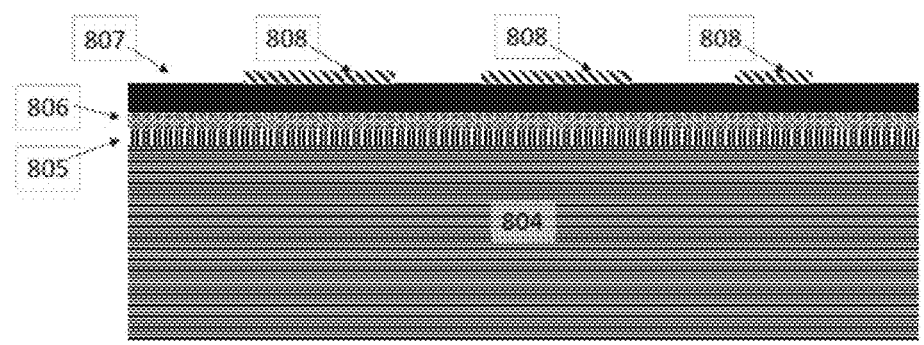
FIG. 8B shows the thin film stack, including a pattern of thin metal film with an oxide surface, deposited on a die prior to bonding according to an embodiment of the disclosed subject matter.
Figure 8C:
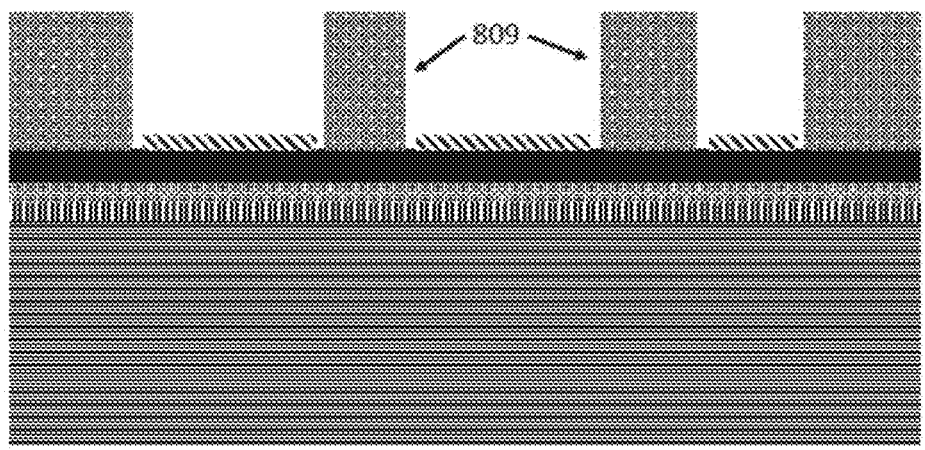
FIG. 8C shows a die with solder applied in cross section according to an embodiment of the disclosed subject matter.

A die with wetting control features on its surface is shown in a facial section in FIG. 8A. The bonding surfaces 801 of the Si die is coated in gold, while the non-bonding regions 802 are coated with a thin film of metal that forms a native oxide to inhibit solder wetting. The large oval regions 802 may correspond to ports on the carrier plate, and the narrower region 803 may correspond to the inspection window 702 shown in FIG. 7B. The die depicted in cross section in FIG. 8B may show the stacks of each thin film. The base Si layer 804 may be covered with an adhesion layer 805, a diffusion blocking layer 806, and a gold capping layer 807. A layer of metal 808 that readily forms a native oxide such as Al, Ti, or Cr may be deposited in a pattern using a shadow mask. This metal pattern may define regions to remain free of solder. A layer of solder 809 may be dispensed over the noble metal covered regions, as shown in FIG. 8C. Solder may be applied in a variety of forms, such as a cut metal preform or a screen-printed paste.

Figure 9A:
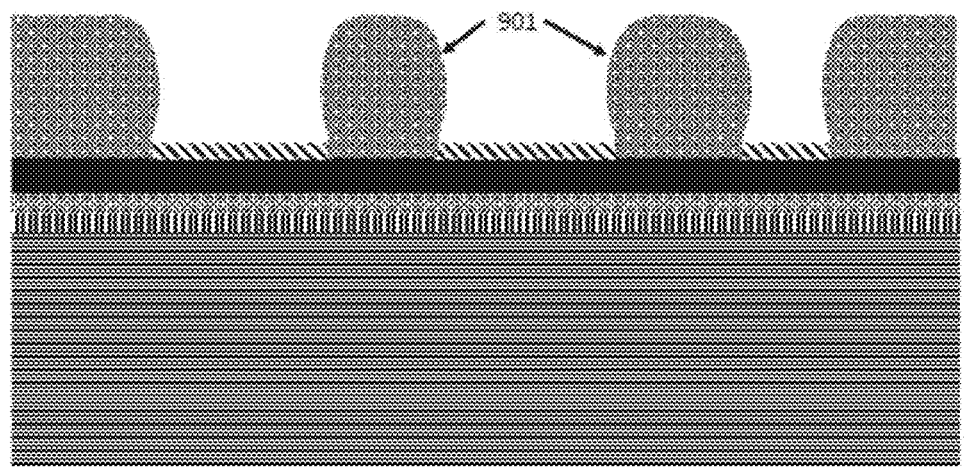
FIG. 9A shows molten solder not spreading into regions of the die surface covered a thin film of metal with an oxide surface according to an embodiment of the disclosed subject matter.
Figure 9B:
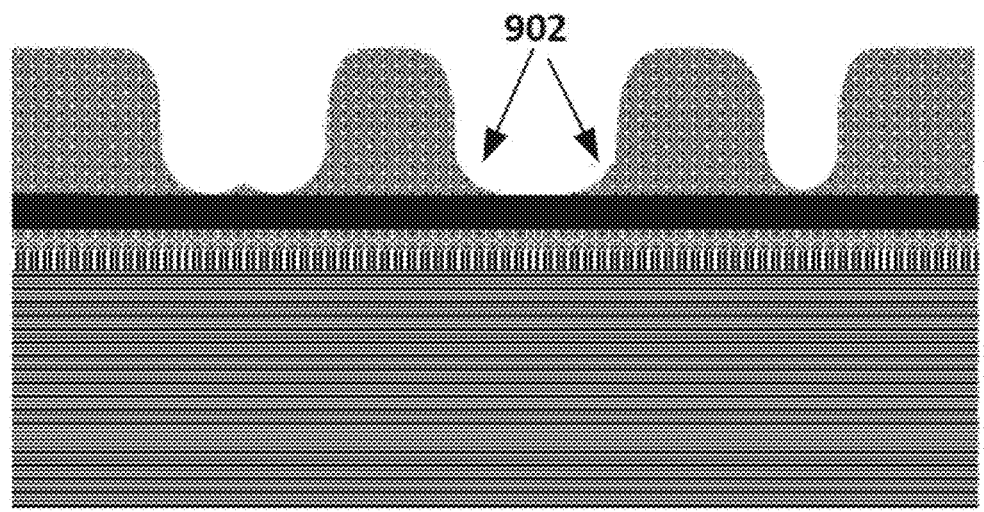
FIG. 9B shows molten solder spreading into regions of the die surface covered a thin film of noble metal according to an embodiment of the disclosed subject matter.

The solder may readily wet to the gold when it is heated past its melting point. The solder may not wet well to the regions of the die coated in oxide, as shown in FIG. 9A. There may be a sharp transition 901 between wetted and non-wetted regions, and the die surface wetted by solder may not extend much beyond the area originally covered by the preform. If the regions of patterned metal oxide are absent, as shown in FIG. 9B, the solder may wet to the die surface in those places 902 and solder coverage may extend past the preform.

This embodiment was experimentally tested as well. A Si substrate was coated on one side with a thin film stack capped by a gold layer by sputtering. A shadow mask divided into 31×21 mm sections with three oval cutouts in each section was then placed on the mask and 20 nm of Ti was deposited so the wafer had an array of oval shaped regions covered in a thin film of Ti. The wafer was then diced into dies matching the pattern of the shadow mask. A solder preform of 0.076 mm thick AuGe eutectic foil was laser cut with holes matching the Ti ovals on the die. The preform was then placed on the die, aligned with the Ti ovals. It was then heated past the reflow temperature of the solder in an inert atmosphere.

Figure 10A:
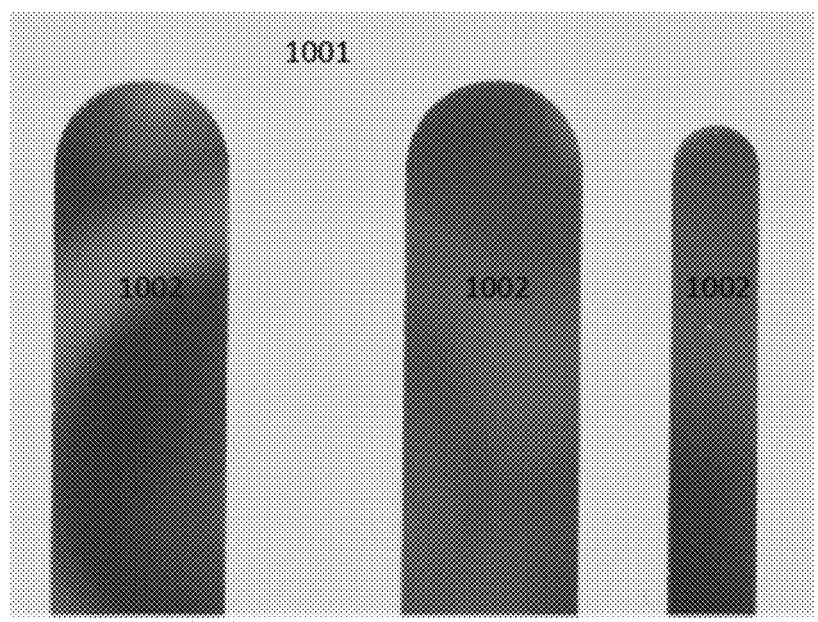
FIG. 10A shows a die with a thin film of patterned metal with an oxide layer after the application of a solder preform according to an embodiment of the disclosed subject matter.
Figure 10B:
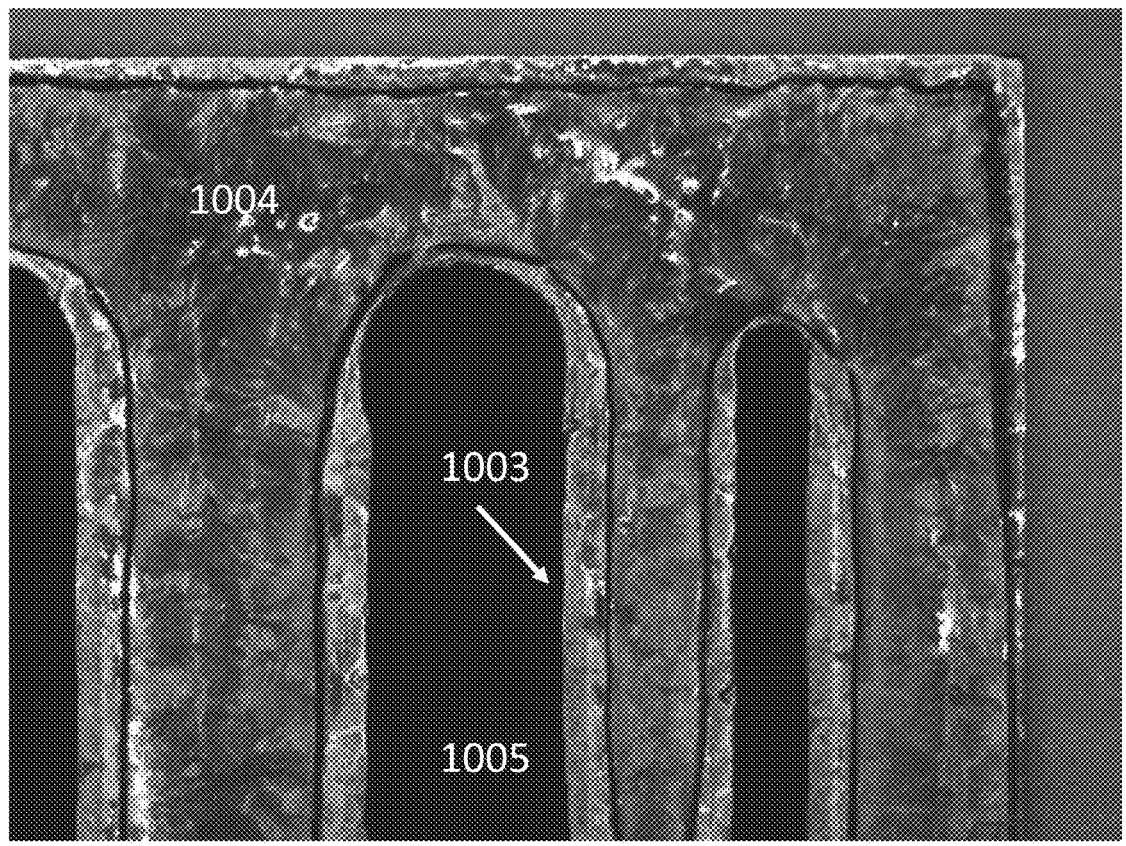
FIG. 10B shows the die in FIG. 10A after the solder is melted according to an embodiment of the disclosed subject matter.
Figure 10C:
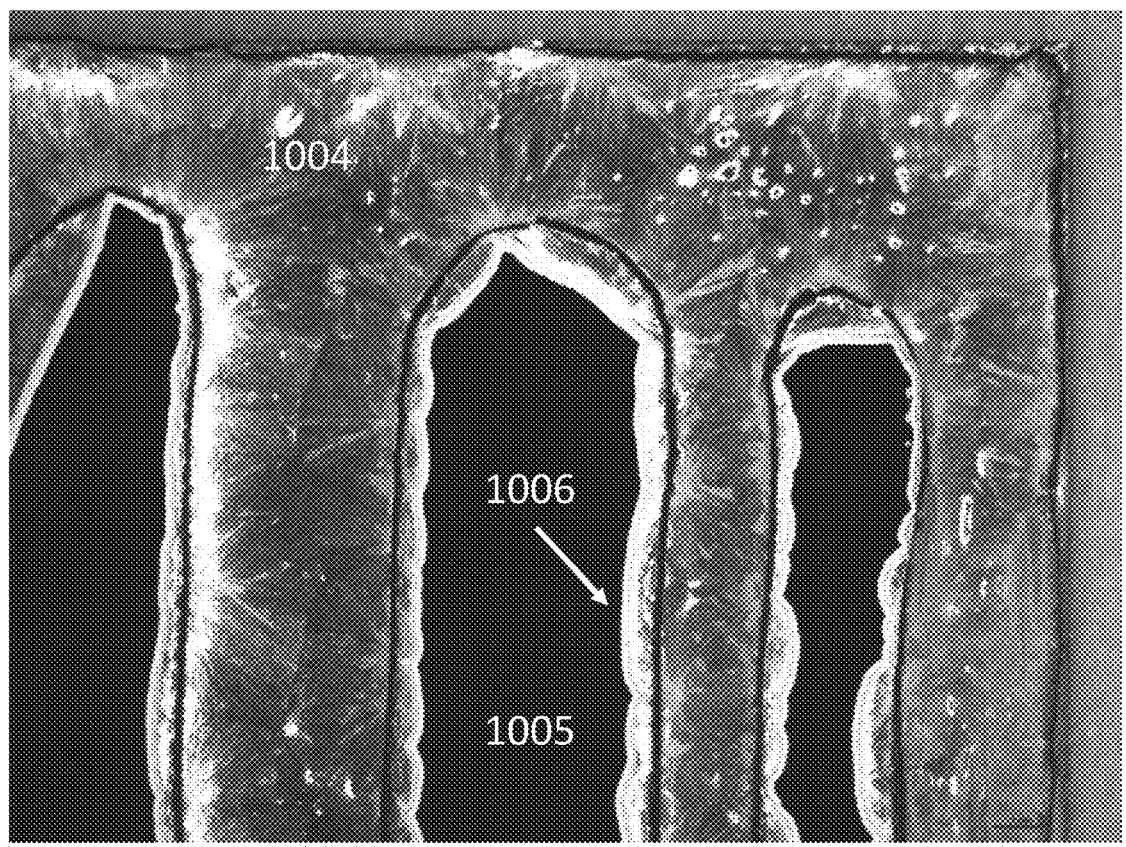
FIG. 10C shows a die without a thin film of patterned metal with an oxide layer after a solder preform is applied and melted according to an embodiment of the disclosed subject matter.

FIGS. 10A-10B show the experimental testing. FIG. 10A shows a die prior to heating. The bright, reflective region 1001 may indicate the portions of the die covered by the solder preform. The darker ovals 1002 may indicate regions where the solder is cut away from the preform and a thin metal film with a native oxide has been deposited on the die. The die is shown after heating in FIG. 10B. While some rounding and spreading of the solder beyond the original outline of the preform is apparent, there is a straight edge 1003 separating regions 1004 that are wetted by solder from regions 1005 that are not wetter by solder. An identical and/or similar preform melted on a die without thin metal film with a native oxide covered regions is shown for comparison in FIG. 10C. The transition 1006 between solder wetted and non-wetted areas may be more uneven and not as clearly defined due to solder moving more freely beyond the edges of the original preform once it is melted.

A die was bonded to a molybdenum carrier plate using AuGe solder in a manner like that described above in connection with the previous embodiment. The sealing performance was similar, indicating that this embodiment may also seal a die to a carrier plate without fouling the vias. This method may be appropriate for use with AuGe eutectic solder, which has a reflow temperature of 365° C. The oxide used in these experiments may become unstable above 400° C. and may no longer control the reflow of solder. The first embodiment where the gold layer itself is masked may not have such a temperature limitation. The choice of embodiment depends primarily on the reflow temperature of the solder used. The embodiment that uses an added oxide layer may be easier to implement and may be used with lower melting solders. The embodiment that masks the gold layer itself may be used for higher melting solders.

The solder preform may be under pressure during bonding, both from the weight of the components within the stack and from any additional compressive force provided by the bonder tooling. Non-wetting areas alone may not be sufficient to control the pressure driven flow of solder. Moats to capture excess solder may be milled into the surface of the carrier plate. So long as the excess solder has a place to go, it will not flow into non-wetting regions. The moats may be routed to run along and inside the inner perimeter of a solder seal surrounding one or more ports on the carrier plate. Moats may usually run along the border of the non-wetting features on the die.

Figure 11:
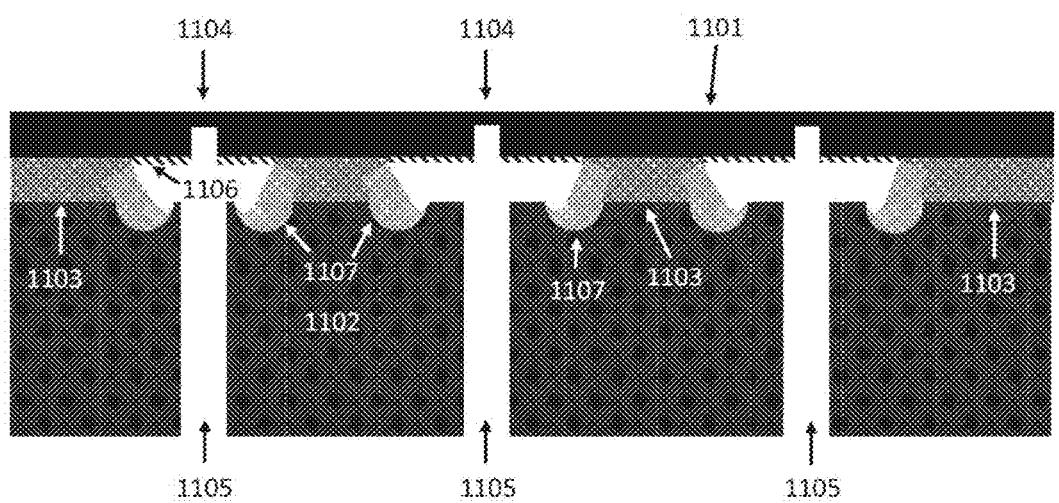
FIG. 11 shows thin films of patterned metal with an oxide layer being used in conjunction with moats on a carrier plate to prevent solder migration into sensitive areas of a die during bonding according to an embodiment of the disclosed subject matter.

Example moats of the embodiments of the disclosed subject matter are shown in FIG. 11. A die 1101 may be bonded to a metal carrier plate 1102 with a layer of solder 1103. The die may include vias 1104 that connect fluidic or pneumatic structures within the die to ports 1105 on the carrier plate. The solder forms seals between the vias and ports. Solder may not migrate to the vias where it may clog or damage structures inside the die. The regions of the die surrounding each via may have a non-wetting surface 1106 to prevent solder from migrating cross the die face due to wetting effects. Excess solder may be captured in moats 1107 milled into the carrier plate to limit pressure driven migration of solder into undesired areas. The combination of wetting control and moats may control the migration of solder when bonding a die and a carrier plate.

As disclosed above in connection with at least FIGS. 3-11, embodiments of the disclosed subject matter may provide a device that may include a carrier plate, and a die having a mating surface with a patterned thin film of metal or metal oxide surface bonded to the carrier plate using a solder preform with voids that overlay the patterned thin film on the die. The metal oxide surface may be disposed opposite a moat in a mating surface of the carrier plate, and the voided regions may remain free of solder when the solder is reflowed. The solder free regions of the device may be discontinuous. The metal oxide surface may disposed on one side of the device, and the moat and at least one port may be disposed on another side of the device.

The die may include a thin metal film stack disposed on the die to promote adhesion of the solder prior to the deposition of the patterned thin film. The stack may include an adhesion layer, a diffusion blocking layer, and/or a gold capping layer. The stack may be disposed on a surface of the die that includes a noble metal, which may be gold.

The patterned thin film of metal of the device may be Al, Ti, and/or Cr. The patterned thin film may be deposited by physical vapor deposition (PVD) through a shadow mask. The patterned thin film of the device may be a metal oxide and a semiconductor oxide.

The device may include one or more sealed fluid connections disposed between the die and the carrier plate with each fluid connection passing through a different solder free region. Perimeters of the regions covered by a patterned thin film of metal covered by the metal oxide surface may correspond to a pattern of the moat or other topographical features to contain the flow of solder formed by bonding the die face onto the carrier plate.

The die of the device may include silicon. The die may include vias, and the solder may be excluded from the vias. The die of the device may include a micronozzle array for organic vapor jet printing (OVJP). The micronozzle array may include a linear array having a plurality of depositors connected in series. A first depositor of the plurality of depositors may border a second depositor on a least one side boundary. A delivery gas distribution channel and an exhaust distribution channel may have separate fluid communication with each of the plurality of depositors. Confinement gas distribution trenches may be disposed between at least the first depositor and the second depositor.

The device may include a metal with a low coefficient of thermal expansion (CTE) over the temperature range between room temperature and a reflow temperature of the solder to bond the die to the carrier plate. The metal may be molybdenum and/or controlled CTE steel.

The device may include a metal carrier plate bonded to the die with a layer of the solder. The metal carrier plate may include moats, where excess solder is captured.

Embodiments of the disclosed subject matter a method may include depositing a film of metal over regions of a die by physical vapor deposition (PVD) using a shadow mask, where the film of metal may form an oxide surface upon exposure to air and prevent solder from readily wetting to the regions that include the film of metal, and where the oxide surface is disposed opposite a moat in a mating surface of a carrier plate. The die may be bonded to the carrier plate using solder preform with voids that overlay the film of metal on the die, where the voided regions remain free of solder when the solder is reflowed.

The metal to form the oxide surface may be deposited on one side of the die, and the moat and at least one port may be on the face of a carrier plate affixed to that side of the die (i.e., the same side of the die as the oxide surface). The metal to form the oxide surface may be titanium, tungsten, and/or gold. In some embodiments, the metal to form the oxide surface may be titanium, tungsten, and/or gold, and an additional metal.

The method may include depositing a stack on the die before depositing the film of metal by depositing an adhesion layer to bond to the oxide surface on the die. A diffusion blocking layer may be deposited to prevent gold from alloying with silicon of the die, and a gold cap may be deposited. The stack may be deposited by at least one of electron beam evaporation and/or plasma sputtering.

The method may include bonding the die to the carrier plate a metal with a low coefficient of thermal expansion (CTE) over the temperature range between room temperature and a reflow temperature of the solder.

The method may include applying a film of patterned solder to the die as a cut metal preform. The method may include depositing a film of patterned solder on a mating surface of the carrier plate using at least one of screen printing, electroplating, and/or sputtering through a shadow mask. The film of metal may be at least one of a metal oxide and a semiconductor oxide.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
    a carrier plate; and
    a die including a mating surface with a patterned thin film having a metal oxide surface bonded to the carrier plate using a solder preform with voids that overlay the patterned thin film on the die, wherein the metal oxide surface is disposed opposite a moat in a mating surface of the carrier plate, wherein the metal oxide surface inhibits solder wetting, and wherein regions with the voids remain free of solder when the solder is reflowed;
    one or more sealed fluid connections disposed between the die and the carrier plate with each fluid connection passing through a different solder free region, and
    wherein the die comprises a micronozzle array for organic vapor jet printing (OVJP).

2. The device of claim 1, wherein the metal oxide surface is disposed on one side of the device, and the moat and at least one port are disposed on the face of the carrier plate affixed to the side of the of the device with the metal oxide surface.

3. The device of claim 1, wherein the die further comprises:
    a thin metal film stack disposed on the die to promote adhesion of the solder prior to the deposition of the patterned thin film.

4. The device of claim 3, wherein the stack comprises an adhesion layer.

5. The device of claim 3, wherein the stack comprises a diffusion blocking layer.

6. The device of claim 3, wherein the stack comprises a gold capping layer.

7. The device of claim 3, wherein the stack is disposed on a surface of the die that includes a noble metal.

8. The device of claim 3, wherein the patterned thin film is the thin metal film stack that promotes adhesion and is patterned to leave bare spots on the die.

9. The device of claim 1, wherein the patterned thin film of metal is at least one selected from the group consisting of: Al, Ti, and Cr.

10. The device of claim 1, wherein the solder free regions are discontinuous.

11. The device of claim 1, wherein perimeters of the regions covered by a patterned thin film of metal covered by the metal oxide surface correspond to a pattern of the moat or other topographical features to contain the flow of solder formed by bonding the die face onto the carrier plate.

12. The device of claim 1, wherein the micronozzle array comprises:
    a linear array having a plurality of depositors connected in series, wherein a first depositor of the plurality of depositors borders a second depositor on a least one side boundary;
    a delivery gas distribution channel and an exhaust distribution channel having separate fluid communication with each of the plurality of depositors; and
    confinement gas distribution trenches disposed between at least the first depositor and the second depositor.

13. The device of claim 1, wherein the die comprises vias, and the solder is excluded from the vias.

14. The device of claim 1, further comprising:
    a metal with a low coefficient of thermal expansion (CTE) over the temperature range between room temperature and a reflow temperature of the solder to bond the die to the carrier plate.

15. The device of claim 14, wherein the metal comprises as least one selected from the group consisting of: molybdenum, and controlled CTE steel.

16. The device of claim 1, further comprising:
    a metal carrier plate bonded to the die with a layer of the solder.

17. The device of claim 16, wherein the metal carrier plate comprises moats, wherein excess solder is captured.

18. The device of claim 1, wherein the patterned thin film includes a semiconductor oxide.

* * * * *